(12) United States Patent
Carden et al.

(10) Patent No.: US 6,538,213 B1
(45) Date of Patent: Mar. 25, 2003

(54) HIGH DENSITY DESIGN FOR ORGANIC CHIP CARRIERS

(75) Inventors: Timothy F. Carden, Vestal, NY (US); Todd W. Davies, Vestal, NY (US); Ross W. Keesler, Endicott, NY (US); Robert D. Sebesta, Endicott, NY (US); David B. Stone, Burlington, VT (US); Cheryl L. Tytran-Palomaki, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/506,951

(22) Filed: Feb. 18, 2000

(51) Int. Cl.[7] ............................. H01R 12/04; H05K 1/11
(52) U.S. Cl. ........................................ 174/262; 174/260
(58) Field of Search ............................... 174/262–267, 174/260; 361/767–771; 29/852

(56) References Cited

U.S. PATENT DOCUMENTS

| | | | |
|---|---|---|---|
| 5,072,075 A | 12/1991 | Lee et al. ..................... | 174/264 |
| 5,483,421 A | 1/1996 | Gedney et al. .............. | 361/771 |
| 5,491,303 A * | 2/1996 | Weiss ........................... | 174/262 |
| 5,574,630 A | 11/1996 | Kresge et al. ............... | 361/792 |
| 5,615,087 A | 3/1997 | Wieloch ........................ | 361/719 |
| 5,689,091 A * | 11/1997 | Hamzehdoost et al. ...... | 174/255 |
| 5,808,873 A * | 9/1998 | Celaya et al. ................ | 361/760 |
| 5,815,374 A * | 9/1998 | Howell ......................... | 174/262 |
| 5,894,173 A | 4/1999 | Jacobs et al. ................ | 257/790 |
| 5,900,675 A | 5/1999 | Appelt et al. ................ | 257/778 |
| 5,936,843 A * | 8/1999 | Ohshima et al. ............. | 361/760 |
| 5,962,922 A * | 10/1999 | Wang ............................ | 257/773 |
| 6,137,062 A * | 10/2000 | Zimmerman ................. | 174/260 |
| 6,162,997 A * | 12/2000 | Memis ........................ | 174/260 |
| 6,163,462 A * | 12/2000 | Buck ........................... | 361/767 |
| 6,239,980 B1 * | 5/2001 | Fillion et al. ................ | 174/250 |
| 6,271,478 B1 * | 8/2001 | Horiuchi et al. ............. | 174/255 |
| 6,288,347 B1 * | 9/2001 | Nakagawa et al. .......... | 174/260 |
| 6,335,495 B1 * | 1/2002 | Farquhar et al. ............. | 174/261 |

OTHER PUBLICATIONS

"High Performance Carrier Technology: Materials And Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

"Process Considerations in the Fabrication of Teflon Printed Circuit Boards", by Light et al, 1994 Proceedings, 44 Electronic Components & Technology Conference, 5/94.

IBM Technical Disclosure Bulletin, vol. 32, No. 3B, Aug. 1989; C.E. Gazdik et al.; Multilayer Polymer Substrate For Direct Chip Attachment; pp. 214–215.

* cited by examiner

Primary Examiner—Albert W. Paladini
Assistant Examiner—Jeremy Norris
(74) Attorney, Agent, or Firm—Schmeiser, Olsen & Watts; Lawrence R. Fraley

(57) ABSTRACT

An organic integrated circuit chip carrier for high density integrated circuit chip attach, wherein the contact pads or microvias which provide electrical interconnections to external circuitry are located in a first array pattern, while the plated through holes or through-vias are located in a second array pattern. This allows utilization of wiring channels within the chip carrier in which signal wiring traces can be routed.

27 Claims, 5 Drawing Sheets

HIGH DENSITY DESIGN FOR ORGANIC CHIP CARRIERS

BACKGROUND OF THE INVENTION

1. Technical Field

This invention relates generally to the attachment of integrated circuit devices to printed circuit boards. More particularly, the invention relates to the attachment of semiconductor integrated circuit (IC) chips to printed circuit boards utilizing an integrated circuit chip carrier, wherein all signal and power connections are made via the integrated circuit integrated circuit chip carrier.

2. Background Art

Integrated circuit chips are readily incorporated into their intended working environments when the integrated circuit chip has been installed in an integrated circuit chip carrier. A typical chip carrier provides an interface between the integrated circuit chip and the circuit board by providing electrical interconnections to off-chip or external devices.

Organic substrates for use in chip carriers have been used and continue to be developed for many applications. These substrates are expected to replace ceramic substrates, particularly in chip carrier applications, due to improved electrical performance and lower cost. However, the use of a multi-layered interconnect structure, such as an organic chip carrier, for interconnecting a semiconductor chip to a printed circuit board in an electronic package introduces many challenges, one of which is the amount of space required between electrical signal circuits within the chip carrier.

As semiconductor chip input/output (I/O) counts increase beyond the capability of peripheral lead devices and as the trend towards semiconductor chip and printed circuit board miniaturization continues, area array interconnects are the preferred method for making large numbers of connections between a semiconductor chip and an organic chip carrier, and between the organic chip carrier and a printed circuit board.

A typical chip carrier includes a top surface and a bottom surface. (The terms "top" and "bottom" are used only to differentiate between the two surfaces, and do not specifically refer to the orientation of the chip or carrier when the structure is mounted on the printed circuit board.) The top surface of the chip carrier has an array of bonding pads which are arranged in a pattern that corresponds to the pattern or "footprint" of the input and output pads on the chip. The bottom surface of the chip carrier has a second set of bonding pads which are connected to the first set of bonding pads by through-vias. A through-via is a (usually) cylindrical hole extending through the thickness of the chip carrier and is lined with a material, such as copper, that acts both as an electrical and a thermal conductor. The through-via provides a path of electrical conduction between the chip and the electrical circuit patterns located within internal layers of the chip carrier. The drilling of through-vias in the carrier is a common approach used to provide signal, ground and power interconnection means.

However, drilling all through-vias utilizing an industry standard grid pattern, such as the Controlled Collapse Chip Connector (C4) solder ball grid, as would be necessary for complete signal, ground, and power interconnections, requires drilling on an extremely narrow pitch (e.g., a 9 mil or less pitch). In order to enable all signal wires to escape through the channels between the drilled holes, a narrow wire (e.g., less than 18 microns) would be required. Designs with such wiring typically result in very low usable product yields.

Other designs have been proposed which incorporate wiring channels and a sequential build process to separate the through-vias from signal circuits. The signal wires in these designs have widths as small as 14 microns. However, such wiring may not meet required resistance specifications. Also, in order to achieve the 14 micron wire width, the plating in the through-vias is necessarily very thin, on the order of 2–3 microns. This relatively thin plating results in deficiencies in the thermal and electrical properties of the through-via. The design approach taken in this invention results in the signal wire width being independent of the plated through hole (PTH) plating thickness.

Thus, there exists a need for an efficient and inexpensive way to increase the packaging density, the electrical performance, and the device reliability of a chip carrier structure. An electronic package that includes a multilayer interconnect structure such as an organic chip carrier, and that provides wiring channels through which electrical signals can be routed, can substantially increase the density of interconnections between the semiconductor chip and the organic chip carrier, and between the organic chip carrier and the printed circuit board. Furthermore, it can enable design of the electronic package to significantly improve electrical performance. It is believed that such a structure would constitute a significant art advancement.

SUMMARY OF THE INVENTION

The present invention provides a structure for a chip carrier which includes placement of through-vias in locations which are considered "off-grid," that is, they are not in a location, when disposed in the interior of the chip carrier, defined by a typical grid coordinate or array pattern system. Relocating through-vias in this manner allows grouping of electrical signal traces into wiring channels which are placed between the through-vias. The use of wiring channels further allows for increased line widths, which result in corresponding increases in product reliability and yield.

The electrical through-via signals are returned to "on-grid" locations (i.e. the array pattern required for further connection) within the multilayer structure using electrically conductive connectors, typically dog-bone shaped, within internal layers. Thus, the electrical signals are again in an array pattern arrangement when they exit the chip carrier from its top and bottom surfaces. The array pattern arrangement on the bottom surface may be similar to that of the top surface. Alternatively, the array pattern arrangement of the bottom surface may represent a significant difference from that of the top surface. For example, there may be an expansion or contraction of the array pattern of the top surface (e.g., a fan-out pattern or fan-in pattern, respectively). These transpositions may be rectilinear or radial, or some combination thereof. Further, a single through-via may connect to more than one microvia, or vice versa.

The return of the through-vias to array pattern locations can be accomplished utilizing blind vias drilled through an external dielectric layer which has been applied to the chip carrier after the through-vias have been drilled and plated. The external dielectric layer will tent and/or fill in the off-grid or non-array pattern through vias. Alternatively, these blind vias may be formed using techniques well known in the art, including laser ablating, plasma etching, mechanical drilling, or photo-imaging.

Generally, the present invention provides an integrated circuit carrier structure including a laminated assembly comprising: a first surface; a second surface substantially parallel to said first surface; an array of contact pads arranged in a first array pattern on said first surface; an array of contact pads arranged in a second array pattern on said second surface; through-vias within said structure for connecting respective contact pads on the first and second surfaces, wherein said through-vias are horizontally displaced from the array pattern on the first surface; and conductive elements which connect the contact pads with the through-vias.

The present invention also provides a printed circuit board assembly comprising: a semiconductor integrated circuit; a printed circuit board; an integrated circuit carrier for mounting the semiconductor integrated circuit to the printed circuit board comprising: a layered structure having a first surface and a second surface substantially parallel to said first surface; an array of contact pads arranged in a first array pattern on said first surface; an array of contact pads arranged in a second array pattern on said second surface; through-vias within said structure for connecting respective contact pads on the first and second surfaces, wherein said through-vias are horizontally displaced from the array pattern on the first surface for the purpose of maximizing available wiring channel volume; and conductive elements which connect the contact pads with the through-vias.

The present invention further provides a method of constructing an integrated circuit carrier structure with a laminated assembly, wherein the laminated assembly includes first and second substantially parallel surfaces, comprising: arranging an array of contact pads in a first array pattern on said first surface; arranging an array of contact pads in a second array pattern on said second surface; forming through-vias within said structure for connecting respective contact pads on the first and second surfaces, wherein said through-vias are horizontally displaced from the array pattern on the first surface; and incorporating conductive elements to connect the contact pads with the through-vias.

It is to be understood that both the foregoing general description and the following detailed description are exemplary, but are not restrictive, of the invention.

BRIEF DESCRIPTION OF THE DRAWINGS

The invention is best understood from the following detailed description when read in conjunction with the accompanying drawings. It is emphasized that, according to common practice and for the sake of clarity, the various features of the drawings are not drawn to scale. On the contrary, the dimensions of the various features may have been arbitrarily expanded or reduced. Included in the drawings are the following figures.

DETAILED DESCRIPTION OF THE PREFERRED EMBODIMENT

Figure 1:
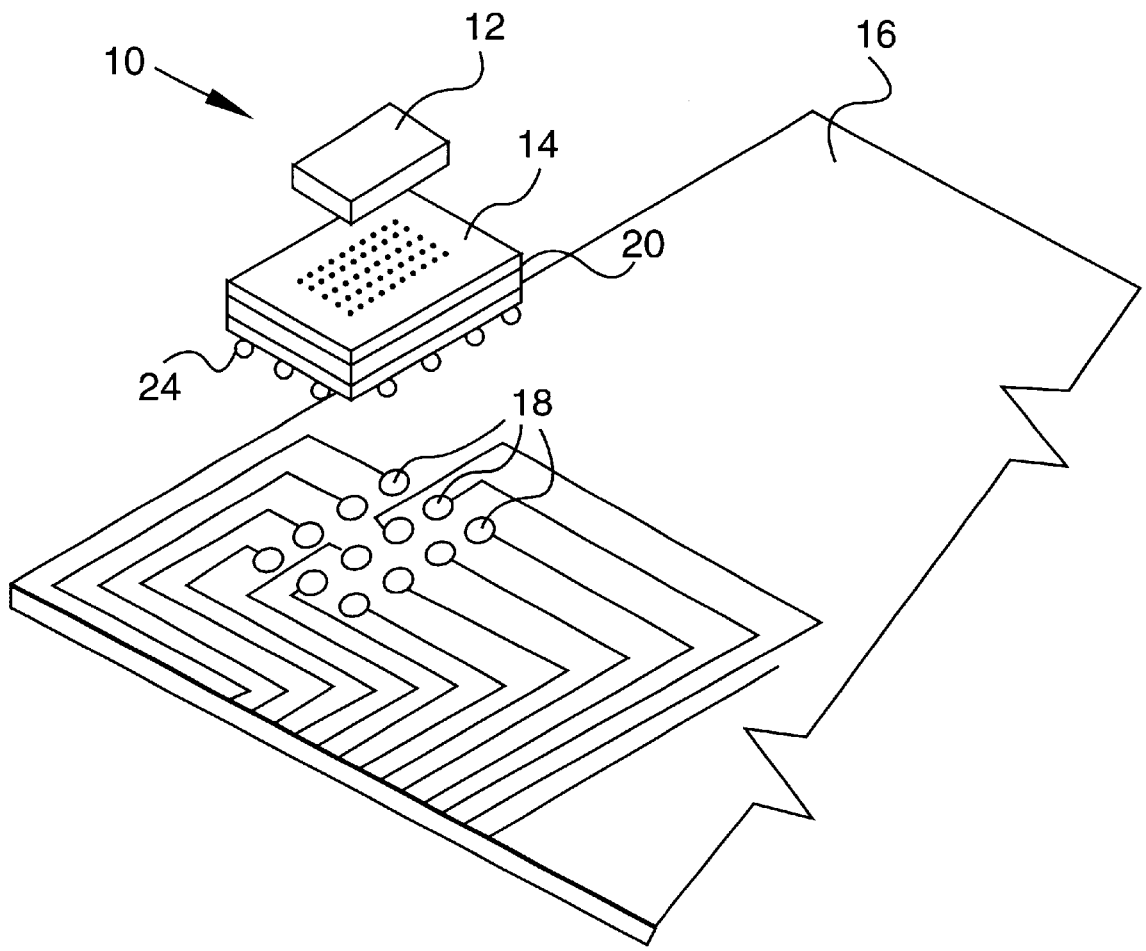
FIG. 1 is a exploded perspective view showing mounting of a semiconductor chip onto a carrier and a carrier onto a printed circuit board according to the present invention.

The present invention provides an organic integrated circuit chip carrier. In particular there is a novel design for routing signal wires from a semiconductor chip via a multilayer chip carrier, while maintaining maximum wiring width for enhanced manufacturing yield. While this invention is susceptible to embodiment in many different forms, there is shown in the drawings, and will be described in detail, a preferred embodiment of the invention. It should be understood, however, that the present disclosure is to be considered as an exemplification of the principles of this invention and is not intended to limit the invention to the embodiment illustrated.

Referring to FIG. 1, this figure shows an exploded perspective view of an electronic package 10 for the mounting of a semiconductor chip 12 onto a carrier 14, and the carrier 14 onto a circuitized substrate 16 (e.g., a printed circuit board). The electronic package 10 includes a multilayer interconnect structure 20, preferably an organic chip carrier, adapted for electronically interconnecting the semiconductor chip 12 to a printed circuit board by means of a plurality of solder balls 24 and conductive pads 18. The multilayer interconnect structure 20 is typically composed of somewhat alternating layers of dielectric and conductive materials (see FIG. 2).

Figure 2:
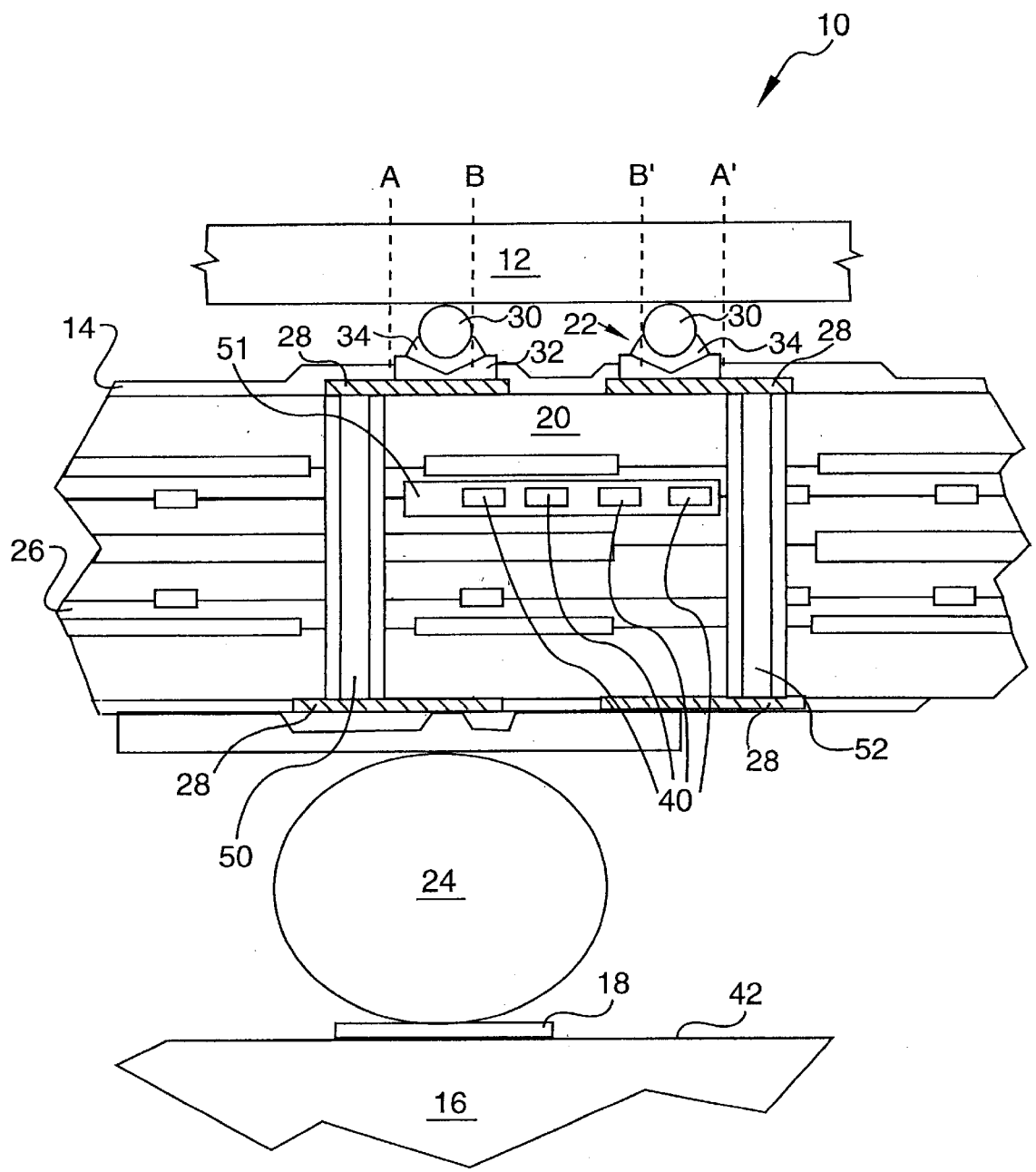
FIG. 2 is a longitudinal sectional view on an enlarged scale from FIG. 1 of an integrated circuit chip, a chip carrier, and a printed circuit board mounted and connected according to the present invention.

As shown in FIG. 2, the multilayer interconnect structure 20 further contains a plurality of microvias 22 and contact pads 32, which are in electrical contact with a plurality of electrically conductive connectors 28 within the chip carrier 14. The plurality of microvias 22 are also in contact with a plurality of contact members 30 on the semiconductor chip 12. Each of the plurality of microvias 22 includes a layer of electrically conductive material 34, preferably copper, although conductive paste or solder are a suitable alternative, positioned on the internal walls of the plurality of microvias 22 and on portions of selected ones of the plurality of electrically conductive members 28.

Selected ones of the plurality of contact pads 32 electrically couple to respective ones of solder connections 34. Each of the solder connections 34 are designed to efficiently match the pattern of contact members 30 on semiconductor chip 12. Preferably, there is a match of no more than one contact member 30 with one of the plated through holes or through-vias, 50, 52, under the semiconductor chip 12 providing a direct electrical path from each contact member 30 to a respective solder ball 24 through a solder connection 34, an electrically conductive member 28, and a plated through hole 50, 52. The direct electrical path from a contact member 30 to a solder ball 24 provides a relatively short and efficient electrical path for electrical signals to be transmitted from the semiconductor chip 12 through the multilayer interconnect structure 20 and to the outside environment through solder balls 24.

Figure 3:
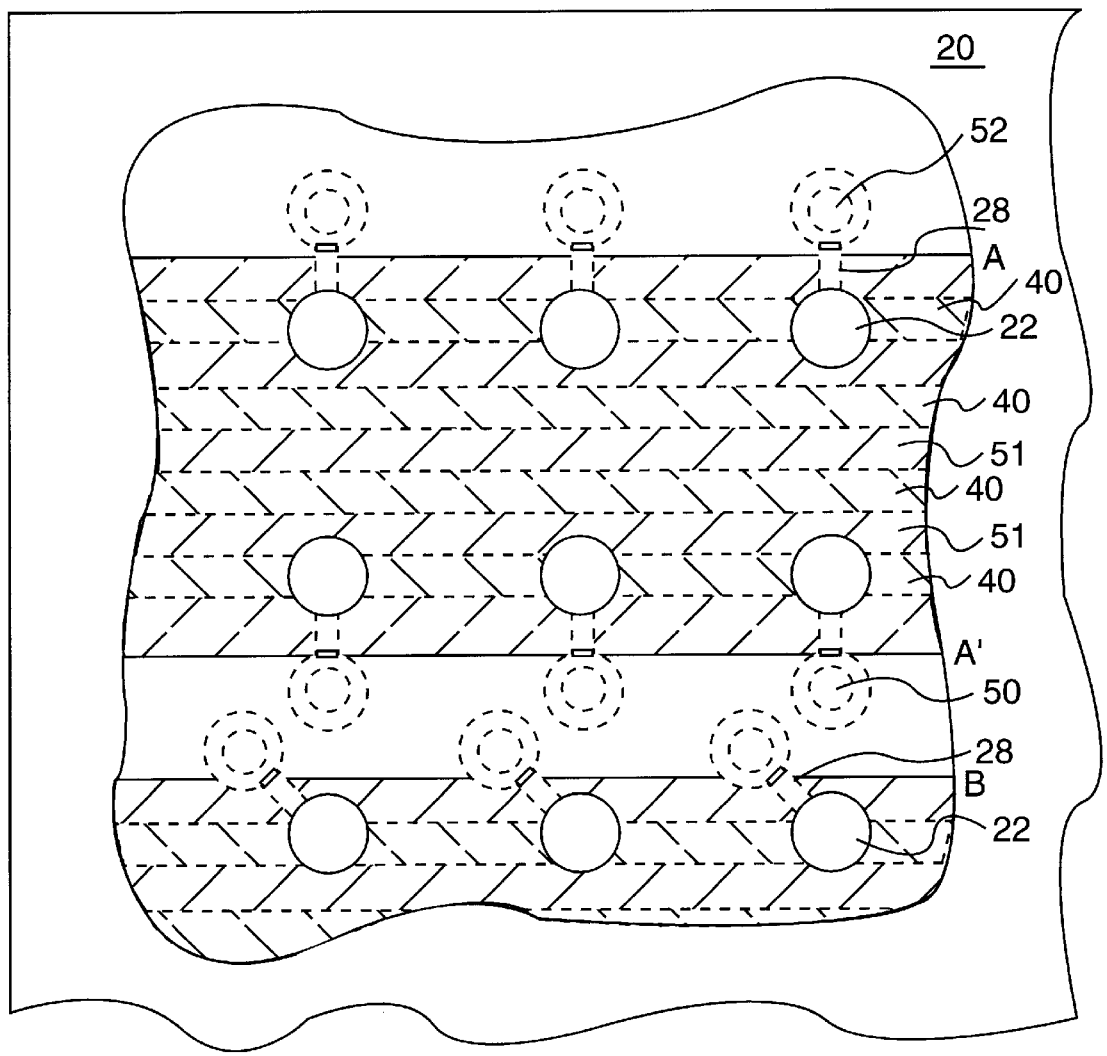
FIG. 3 depicts an overhead view of the upper surfaces of the chip carrier structure of FIG. 2 according to the present invention.

Placement of the plated through holes (PTH's), or through-vias, permits wiring channels 51 with sufficient space to accommodate electrically conductive traces for the routing of electrical signal, power and ground signals. As depicted in FIGS. 2 and 3, the wiring channel 51 extends from the edge of one plated through hole 50 to the edge of another plated through hole 52. The width of the wiring channel 51, shown extending from A to A', represents a significant increase in the space available within which signal traces 40 are routed. Related art designs are limited to a wiring channel width shown as B to B' (FIG. 2).

Referring to FIG. 2, the electronic package 10 can further include a circuitized substrate 16 (e.g., a printed circuit board) having a plurality of contact pads 18 on a first surface 42. The contact pads 18 are electrically connected to respective ones of solder balls 24 on a multilayer interconnect structure 20. Typically, the solder balls 24 are arranged in a ball grid array (BGA) arrangement to efficiently allow electrical signal transmission and power distribution out of and into the electronic package 10. The solder balls 24 can also be comprised of columns or other shapes to provide the appropriate stand-off and appropriate strain relief between multilayer interconnect structure 20 and circuitized substrate 16.

Referring to FIG. 3, there is shown an overhead view of the present invention, further illustrating how the through-vias 50, 52 are moved off-grid using dog-bone shaped electrically conductive connectors 28. The phrase dog-bone shaped refers to a shape comprising a shank portion connected to a pair of eye portions at each end of the shank. The dog-bone shaped electrically conductive connectors 28 include the conductive materials surrounding plated through hole 52 and microvia 22. The dog-bone shaped conductors 28 may be formed in any layer, but are shown here formed near the surface for clarity. The microvias 22 and contact pads 32 (not shown) remain on grid, while the PTH's 50, 52 have been moved off-grid to increase the wiring channel 51 space available for routing multiple signal traces 40 on the internal signal layers 26 (see FIG. 2). In one embodiment of the invention, there is provided, in the optimized wiring channel 51, enough space for four signal traces 40 with a minimum line width of 28 microns.

Figure 4:
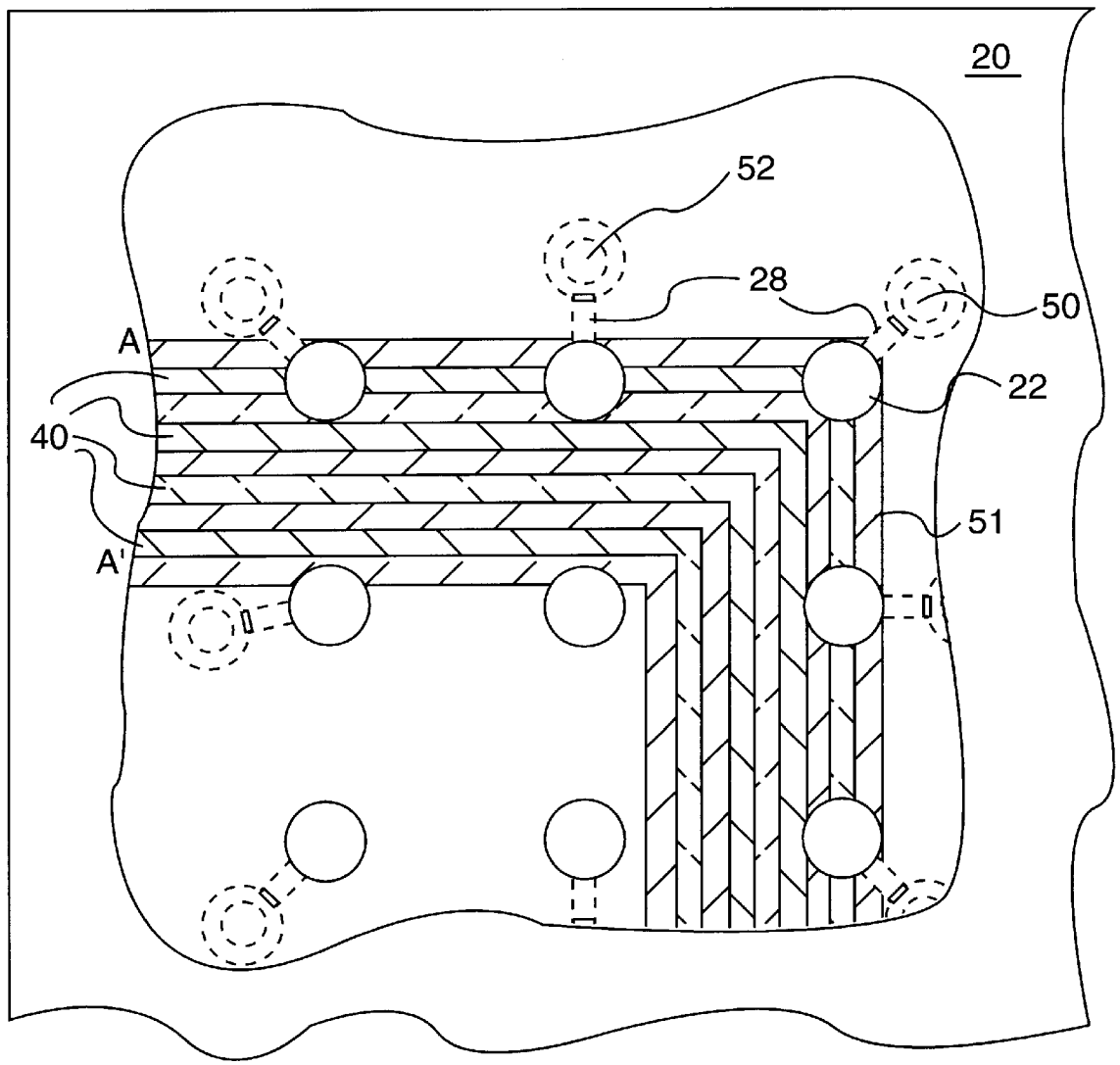
FIG. 4 depicts an overhead view of the upper surfaces of the chip carrier of FIG. 2 according to a possible embodiment of the present invention.

FIG. 4 depicts an overhead view of another possible embodiment of the present invention, illustrating how the through-vias 50, 52 are moved off-grid in a somewhat radial fashion, using dog-bone shaped conductors 28. The dog-bone shaped conductors 28 may be formed in any layer, but are shown here formed near the surface for clarity. The microvias 22 and contact pads 32 (not shown) remain on grid, while the through-vias have been moved off-grid to increase the wiring channel 51 space available for wiring a plurality (e.g., four) of signal traces 40 per channel 51 on the internal layers 26, while maintaining a wider trace width (e.g., at least 28 microns) for increased manufacturability.

Figure 5:
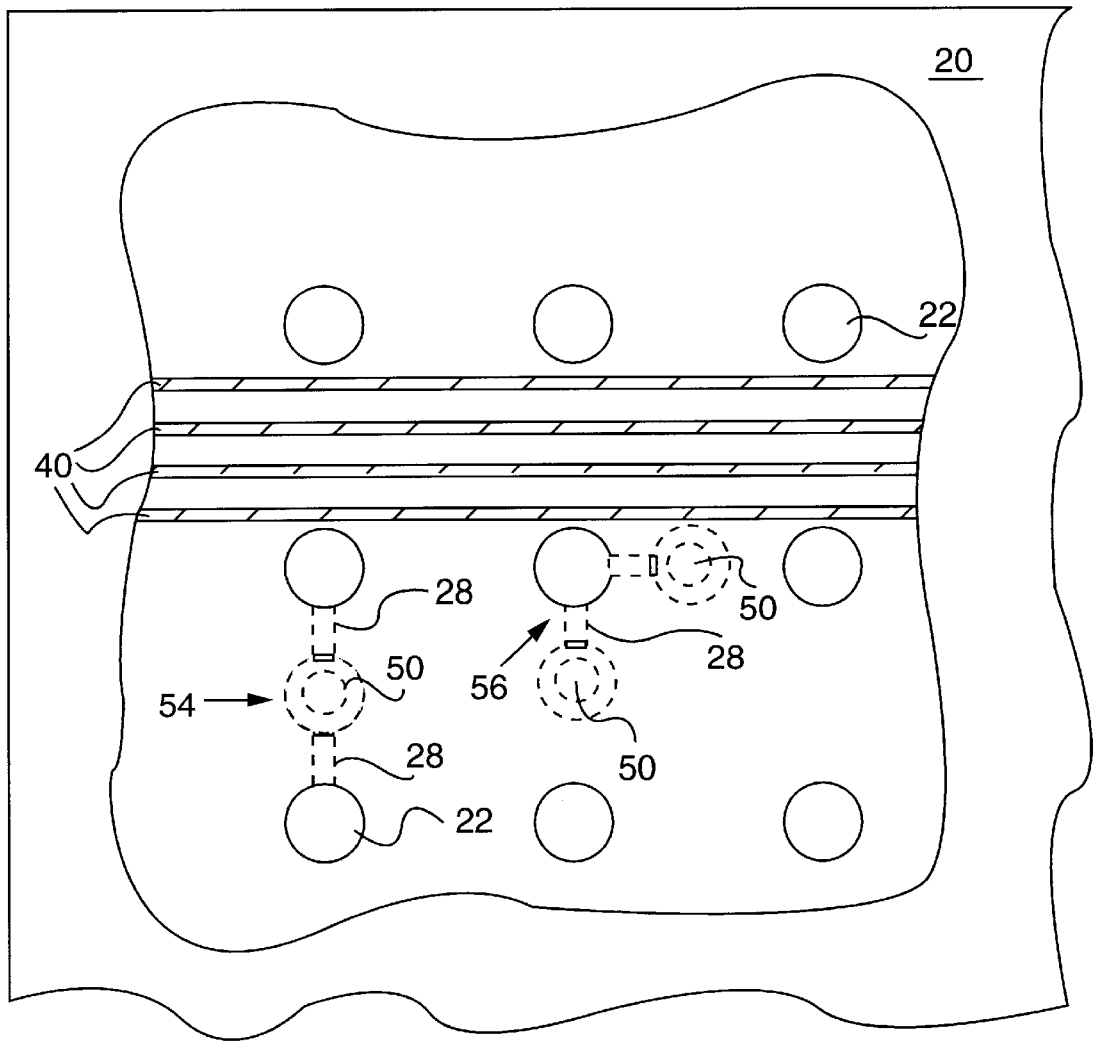
FIG. 5 depicts an overhead view of the upper surfaces of the chip carrier of FIG. 2 according to another possible embodiment of the present invention.

FIG. 5 illustrates an overhead view of another possible embodiment of the present invention in which two alternative connection patterns are shown. Pattern 54 shows two microvias 22 connected to a single through-via 50; while pattern 56 shows a single microvia 22 connected to two through-vias 50. In both of these patterns, the connection from the microvia 22 to the through-via 50 is made with a dog-bone shaped electrically conductive connector 28.

The foregoing specification is intended as illustrative and is not intended to be taken as limiting. Still other variations within the spirit and scope of this invention are possible and will readily present themselves to those skilled in the art.

What is claimed is:

1. An integrated circuit carrier structure including a laminated assembly, said laminated assembly comprising:
    a first surface;
    a second surface substantially parallel to said first surface;
    a first two-dimensional array of contact pads arranged in a first grid on said first surface, said first two-dimensional array of contact pads corresponding to an array of first contact members for contacting a first substrate;
    a second two-dimensional array of contact pads arranged in a second grid on said second surface, said second two-dimensional array of contact pads corresponding to an array of second contact members for contacting a second substrate;
    through-vias within said structure for connecting respective contact pads on the first and second surfaces, wherein said through-vias are horizontally positioned off-grid relative to contact members selected from the group consisting of said first contact members, said second contact members, and a combination of said first and second contact members, and further wherein each of said through-vias extends along a straight line from said first surface to said second surface; and
    conductive elements which connect the corresponding contact pads with the through-vias.

2. The integrated circuit carrier structure of claim 1, further comprising:
    volumes within said structure which are maximized to form the largest wiring channel possible between sets of through-vias, wherein the volumes are located between the through-vias.

3. The integrated circuit carrier structure of claim 2, wherein said wiring channels contain a plurality of electrical signal lines.

4. The integrated circuit carrier structure of claim 1, wherein said conductive elements are dog-bone shaped.

5. The integrated circuit carrier structure of claim 1, wherein the contact pads arranged on said second surface are blind vias.

6. The integrated circuit carrier structure of claim 1, wherein said through-vias are positioned off-grid an equal distance relative to a centerline of said first contact members and a centerline of said second contact members.

7. The integrated circuit carrier structure of claim 1, wherein said through-vias are positioned off-grid a first distance relative to a centerline of said first contact members, and a second distance from a centerline of said second contact members, wherein said first distance does not equal said second distance.

8. The integrated circuit carrier structure of claim 1, wherein:
    said first two dimensional array of contact pads includes a first axis and a second axis, said first axis defined by a first centerline extending along a row of said contact pads, said second axis defined by a second centerline along one of said conductive elements; and
    said first axis and said second axis form an angle of about 90 degrees.

9. The integrated circuit carrier structure of claim 1, wherein:
    said first two dimensional array of contact pads includes a first axis and a second axis, said first axis defined by a first centerline extending along a row of said contact pads, said second axis defined by a second centerline along one of said conductive elements; and
    said first axis and said second axis form an acute angle.

10. The integrated circuit carrier structure of claim 1, wherein:
    said first two dimensional array of contact pads including a first axis, a second axis, and a third axis, said first axis defined by a first centerline extending along a row of said contact pads, said second axis defined by a second centerline along a first one of said conductive elements, said third axis defined by a third centerline along a second one of said conductive elements;
    said first axis and said second axis forming a first angle;
    said first axis and said third axis forming a second angle; and wherein said first angle and said second angle are not approximately equal.

11. The integrated circuit carrier structure of claim 1, wherein two conductive elements from a two dimensional array are connected to the same through-via.

12. The integrated circuit carrier structure of claim 1, wherein one conductive element is connected to at least two different through-vias.

13. A printed circuit board assembly comprising:
   a semiconductor integrated circuit;
   a printed circuit board;
   an integrated circuit carrier for mounting the semiconductor integrated circuit to the printed circuit board comprising:
      a layered structure having a first surface and a second surface substantially parallel to said first surface;
      a first two-dimensional array of contact pads arranged in a first grid on said first surface, said first two-dimensional array of contact pads corresponding to an array of first contact members for contacting a first substrate;
      a second two-dimensional array of contact pads arranged in a second grid on said second surface, said second two-dimensional array of contact pads corresponding to an array of second contact members for contacting a second substrate;
      through-vias within said structure for connecting respective contact pads on the first and second surfaces, wherein said through-vias are positioned horizontally off-grid relative to contact members selected from the group consisting of said first contact members, said second contact members, and a combination of said first and second contact members, for the purpose of maximizing available wiring channel volume, and further wherein each of said through-vias extends along a straight line from said first surface to said second surface; and
      conductive elements which connect the corresponding contact pads with the through-vias.

14. The printed circuit board assembly of claim 13, further comprising:
   volumes within said structure which are maximized to form the largest wiring channels possible between sets of through-vias, wherein the volumes are located between the through-vias.

15. A method of constructing an integrated circuit carrier structure with a laminated assembly, wherein the laminated assembly includes first and second substantially parallel surfaces, comprising:
   arranging a two-dimensional array of contact pads in a first grid on said first surface, said first two-dimensional array of contact pads corresponding to an array of first contact members for contacting a first substrate;
   arranging a two-dimensional array of contact pads in a second grid on said second surface, said second two-dimensional array of contact pads corresponding to an array of second contact members for contacting a second substrate;
   forming through-vias within said structure for connecting respective contact pads on the first and second surfaces, wherein said through-vias are positioned horizontally off-grid relative to contact members selected from the group consisting of said first contact members, said second contact members, and a combination of said first and second contact members, and further wherein each of said through-vias extends along a straight line from said first surface to said second surface; and
   incorporating conductive elements to connect the corresponding contact pads with the through-vias.

16. The method of claim 15, further comprising the steps of:
   creating volumes for maximum wiring channel volume within said structure, between said through-vias; and
   forming wiring channels within said volumes.

17. The method of claim 15, wherein the conductive elements are dog-bone shaped.

18. The method of claim 15, wherein the wiring channels contain a plurality of electrical signal lines.

19. The method of claim 15, wherein the contact pads arranged on said second surface are blind vias.

20. The method of claim 19, wherein said blind vias are formed from one of the following processes: laser ablating, photo-imaging, plasma etching, or mechanical drilling.

21. The method of claim 15, wherein the structure is formed from a material selected from the group consisting of a ceramic material and an organic material.

22. The method of claim 15, further comprising:
   determining a first axis and a second axis of said first two dimensional array of contact pads, said first axis defined by a first centerline extending along a row of said contact pads, said second axis defined by a second centerline along one of said conductive elements; and
   forming an angle of about 90 degrees between said first axis and said second axis.

23. The method of claim 15, further comprising:
   determining a first axis and a second axis of said first two dimensional array of contact pads, said first axis defined by a first centerline extending along a row of said contact pads, said second axis defined by a second centerline along one of said conductive elements; and
   forming an acute angle between said first axis and said second axis.

24. The method of claim 15, further comprising:
   determining a first axis, a second axis, and a third axis of said first two dimensional array of contact pads, said first axis defined by a first centerline extending along a row of said contact pads, said second axis defined by a second centerline along a first one of said conductive elements, said third axis defined by a third centerline along a second one of said conductive elements;
   wherein said first axis and said second axis form a first angle;
   wherein said first axis and said third axis form a second angle; and
   wherein said first angle and said second angle are not approximately equal.

25. The method of claim 15, further comprising connecting two conductive elements, from the same two dimensional array, to the same through-via.

26. The method of claim 15, further comprising connecting one conductive element to at least two different through-vias.

27. A method of constructing an integrated circuit carrier structure with a laminated assembly, wherein the laminated assembly includes first and second substantially parallel surfaces, said method comprising:
   arranging a two-dimensional array of first contact pads in a first grid on said first surface;
   arranging a two-dimensional array of second contact pads in a second grid on said second surface;
   forming through-vias within said structure for connecting respective contact pads on the first and second surfaces, wherein said through-vias are positioned horizontally off-grid; and incorporating conductive elements to connect the respective contact pads with the through-vias, wherein the conductive elements are used to position the through-vias off-grid relative to selected contact pads comprising a subset of said first contact pads, a subset of said second contact pads, and a combination thereof.

* * * * *